(12) United States Patent
Lin

(10) Patent No.: US 12,114,556 B2
(45) Date of Patent: Oct. 8, 2024

(54) DISPLAY PANEL AND A MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Gaobo Lin, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/618,481

(22) PCT Filed: Nov. 23, 2021

(86) PCT No.: PCT/CN2021/132571
§ 371 (c)(1),
(2) Date: Dec. 12, 2021

(87) PCT Pub. No.: WO2023/087336
PCT Pub. Date: May 25, 2023

(65) Prior Publication Data
US 2024/0016033 A1  Jan. 11, 2024

(30) Foreign Application Priority Data

Nov. 16, 2021 (CN) .......................... 202111357180.5

(51) Int. Cl.
*H10K 59/80* (2023.01)
*H10K 59/12* (2023.01)
*H10K 59/122* (2023.01)

(52) U.S. Cl.
CPC ... *H10K 59/80522* (2023.02); *H10K 59/1201* (2023.02); *H10K 59/122* (2023.02)

(58) Field of Classification Search
CPC ......... H10K 59/80522; H10K 59/1201; H10K 59/122; H10K 59/1315; H10K 59/124; H10K 59/1213; H10K 59/123
See application file for complete search history.

(56) References Cited

U.S. PATENT DOCUMENTS

2011/0220898 A1  9/2011  Yoon et al.
2012/0091459 A1  4/2012  Choi et al.
(Continued)

FOREIGN PATENT DOCUMENTS

CN  101465368 B  7/2011
CN  110911461 A  3/2020
(Continued)

OTHER PUBLICATIONS

International Search Report in International application No. PCT/CN2021/132571, mailed on Jul. 28, 2022.
(Continued)

*Primary Examiner* — J. E. Schoenholtz
(74) *Attorney, Agent, or Firm* — PV IP PC; Wei Te Chung

(57) ABSTRACT

Embodiments of the application disclose a display panel and a manufacturing method thereof. The driving circuit layer includes an auxiliary electrode, the auxiliary electrode includes a first conductive layer, a second conductive layer, and a third conductive layer that are stacked, the first conductive layer includes a protrusion portion protruding from the second conductive layer, and the third conductive layer includes an overhang portion protruding from the second conductive layer, wherein the overhang portion, the second conductive layer, and the protrusion portion define (Continued)

an undercut space; and the second electrode extends into the undercut space and is connected to the protrusion portion.

20 Claims, 6 Drawing Sheets

(56) References Cited

U.S. PATENT DOCUMENTS

| | | | | |
|---|---|---|---|---|
| 2021/0408441 | A1* | 12/2021 | Lee | H10K 50/824 |
| 2022/0384559 | A1* | 12/2022 | Zeng | H10K 59/1315 |
| 2024/0016016 | A1* | 1/2024 | Kim | H10K 59/124 |

FOREIGN PATENT DOCUMENTS

| | | |
|---|---|---|
| CN | 111047994 A | 4/2020 |
| CN | 111969034 A | 11/2020 |
| CN | 112289945 A | 1/2021 |
| CN | 112289946 A | 1/2021 |
| CN | 113097406 A | 7/2021 |
| CN | 113097407 A | 7/2021 |
| CN | 113097412 A | 7/2021 |
| CN | 113130593 A | 7/2021 |
| CN | 113345945 A | 9/2021 |
| CN | 113871430 A | 12/2021 |
| IN | 110071225 A | 7/2019 |

OTHER PUBLICATIONS

Written Opinion of the International Search Authority in International application No. PCT/CN2021/132571, mailed on Jul. 28, 2022.

Chinese Office Action issued in corresponding Chinese Patent Application No. 202111357180.5 dated Oct. 12, 2022, pp. 1-15.

* cited by examiner forming a driving circuit layer on the substrate, wherein the driving circuit layer comprises an auxiliary electrode, the auxiliary electrode comprises a first conductive layer, a second conductive layer, and a third conductive layer that are stacked, and the second conductive layer is disposed between the first conductive layer and the third conductive layer; —B1 forming a first electrode on the driving circuit layer, and defining an undercut space on the auxiliary electrode, wherein the first conductive layer comprises an overhang portion protruding from the second conductive layer, the third conductive layer comprises a protrusion portion protruding from the second conductive layer, wherein the overhang portion, a side surface of the second conductive layer, and the protrusion portion define an undercut space; —B2 sequentially forming a pixel definition layer, a light-emitting layer, and a second electrode on the first electrode, wherein the light-emitting layer is disconnected from the second electrode at the undercut space, and the second electrode extends into the undercut space and is connected to the protrusion portion. —B3

FIG. 4

DISPLAY PANEL AND A MANUFACTURING METHOD THEREOF

BACKGROUND OF INVENTION

Field of Invention

The present application relates to the field of display technology, in particular to a display panel and a manufacturing method thereof.

Description of Prior Art

The organic light-emitting diode (OLED) display panel structure includes a transparent anode layer, a light-emitting layer, and a metal cathode layer. In order to increase transmittance of top emission, a thickness of the metal cathode layer is relatively thin, which leads to high resistance and serious current voltage drop, resulting in obvious uneven brightness of the display panel, thus seriously impacting a display effect of the OLED display device. In order to alleviate unevenness of the display brightness of the panel, an auxiliary electrode can be introduced to connect to the relatively thin metal cathode layer. Because a resistance of the auxiliary electrode is small, the current voltage drop is reduced, and when power is turned on, impedance of the cathode of the panel and the current voltage drop are reduced, and brightness uniformity is improved to a certain extent.

In processes of research and practice of the prior art, the inventor(s) of the present application found that, as shown in FIG. 1, a connection between the auxiliary electrode 01 and the metal cathode 02 is realized usually by additionally providing a third metal layer 03 to form an undercut structure Un, that is, a metal layer 03 that is arranged at a different layer from the auxiliary electrode 01 is disposed on the auxiliary electrode 01, which complicates the manufacturing process and adds two photomasks to the manufacturing process, thus reducing production efficiency.

SUMMARY OF INVENTION

Embodiments of the present application provide a display panel and a manufacturing method thereof, which can save manufacturing steps and reduce costs.

An embodiment of the present application provides a display panel, which includes:
a substrate;
a driving circuit layer disposed on the substrate, wherein the driving circuit layer includes an auxiliary electrode, the auxiliary electrode includes a first conductive layer, a second conductive layer, and a third conductive layer that are stacked, the second conductive layer is disposed between the first conductive layer and the third conductive layer, the first conductive layer includes a protrusion portion protruding from the second conductive layer, and the third conductive layer includes an overhang portion protruding from the second conductive layer, wherein the overhang portion, a side surface of the second conductive layer, and the protrusion portion define an undercut space;
a first electrode disposed on the driving circuit layer;
a pixel definition layer disposed on the first electrode, and
a light-emitting layer and a second electrode, wherein the light-emitting layer is disposed on the first electrode, the second electrode is disposed on the light-emitting layer, the light-emitting layer is disconnected from the second electrode at the undercut space, and the second electrode extends into the undercut space and is connected to the protrusion portion.

Optionally, in some embodiments of the present application, the driving circuit layer includes a source-drain conductive layer disposed on the substrate, the auxiliary electrode is formed in the source-drain conductive layer, and the source-drain conductive layer also includes source and drain electrodes.

Optionally, in some embodiments of the present application, an activity of the first conductive layer is weaker than an activity of the second conductive layer, and an activity of the third conductive layer is weaker than the activity of the second conductive layer.

Optionally, in some embodiments of the present application, a thickness of the second conductive layer is greater than a thickness of the first conductive layer.

Optionally, in some embodiments of the present application, materials of the first conductive layer and the third conductive layer are the same, and the material of the first conductive layer includes a metal alloy, and material of the second conductive layer is metal; and an activity of the metal alloy is weaker than an activity of the metal.

Optionally, in some embodiments of the present application, the driving circuit layer further includes a protective layer and a planarization layer, the protective layer is disposed on the source-drain conductive layer, and the planarization layer is disposed on the protective layer;
    the driving circuit layer is provided with a connection via hole, and the connection via hole penetrates the planarization layer and the protective layer; and
    the connection via hole exposes the auxiliary electrode, and a buffer space is defined between the first conductive layer and the connection via hole.

Optionally, in some embodiments of the present application, the protective layer is connected to a side surface of the auxiliary electrode, and a part of the protective layer extends to cover a part of the auxiliary electrode.

An embodiment of the present application also relates to a display panel, which includes:
a substrate;
a driving circuit layer disposed on the substrate, wherein the driving circuit layer includes an auxiliary electrode, the auxiliary electrode includes a first conductive layer, a second conductive layer, and a third conductive layer that are stacked, the second conductive layer is disposed between the first conductive layer and the third conductive layer, the first conductive layer includes a protrusion portion protruding from the second conductive layer, and the third conductive layer includes an overhang portion protruding from the second conductive layer, wherein the overhang portion, a side surface of the second conductive layer, and the protrusion portion define an undercut space;
a first electrode disposed on the driving circuit layer; and
a light-emitting layer and a second electrode, wherein the light-emitting layer is disposed on the first electrode, the second electrode is disposed on the light-emitting layer; the light-emitting layer is disconnected from the second electrode at the undercut space; and the second electrode extends into the undercut space and is connected to the protrusion portion.

Optionally, in some embodiments of the present application, the driving circuit layer includes a source-drain conductive layer disposed on the substrate, the auxiliary electrode is formed in the source-drain conductive layer, and the source-drain conductive layer also includes source and drain electrodes.

Optionally, in some embodiments of the present application, an activity of the first conductive layer is weaker than an activity of the second conductive layer, and an activity of the third conductive layer is weaker than the activity of the second conductive layer.

Optionally, in some embodiments of the present application, a thickness of the second conductive layer is greater than a thickness of the first conductive layer.

Optionally, in some embodiments of the present application, materials of the first conductive layer and the third conductive layer are the same, and the material of the first conductive layer includes a metal alloy, and a material of the second conductive layer is metal; and an activity of the metal alloy is weaker than an activity of the metal.

Optionally, in some embodiments of the present application, the driving circuit layer further includes a protective layer and a planarization layer, the protective layer is disposed on the source-drain conductive layer, and the planarization layer is disposed on the protective layer;

the driving circuit layer is provided with a connection via hole, and the connection via hole penetrates the planarization layer and the protective layer; and the connection via hole exposes the auxiliary electrode, and a buffer space is defined between the first conductive layer and the connection via hole.

Optionally, in some embodiments of the present application, the protective layer is connected to a side surface of the auxiliary electrode, and a part of the protective layer extends to cover a part of the auxiliary electrode.

Correspondingly, the present application also relates to a method of manufacturing a display panel, which includes the following steps:

forming a driving circuit layer on the substrate, wherein the driving circuit layer includes an auxiliary electrode, the auxiliary electrode includes a first conductive layer, a second conductive layer, and a third conductive layer that are stacked, and the second conductive layer is disposed between the first conductive layer and the third conductive layer;

forming a first electrode on the driving circuit layer, and defining an undercut space on the auxiliary electrode, wherein the first conductive layer includes an overhang portion protruding from the second conductive layer, the third conductive layer includes a protrusion portion protruding from the second conductive layer, wherein the overhang portion, a side surface of the second conductive layer, and the protrusion portion define an undercut space; and sequentially forming a pixel definition layer, a light-emitting layer, and a second electrode on the first electrode, wherein the light-emitting layer is disconnected from the second electrode at the undercut space, and the second electrode extends into the undercut space and is connected to the protrusion portion.

Optionally, in some embodiments of the present application, the step of forming the driving circuit layer on the substrate includes the following steps:

forming a buffer layer on the substrate;
forming an active layer on the buffer layer;
forming a first insulating layer on the buffer layer;
forming a gate metal layer on the buffer layer, wherein the gate metal layer includes a gate electrode;
forming a second insulating layer on the buffer layer;

forming a source-drain conductive layer on the second insulating layer, wherein the source-drain conductive layer includes an auxiliary electrode, a source electrode, and a drain electrode; and sequentially forming a protective layer, a planarization layer, and a connection via hole on the source-drain conductive layer, wherein the connection via hole exposes at least one side surface of the auxiliary electrode.

Optionally, in some embodiments of the present application, a buffer space is defined between the first conductive layer and a wall of the connection via hole.

Optionally, in some embodiments of the present application, the step of forming the first electrode on the driving circuit layer, and defining the undercut space on the auxiliary electrode includes the following steps:

forming an electrode material layer on the planarization layer, wherein a part of the electrode material layer covers the auxiliary electrode;

forming a photoresist layer on the electrode material layer;

patterning the photoresist layer to form a first opening and a second opening, wherein the first opening corresponds to the connection via hole, and the second opening corresponds to a non-pixel area;

etching the electrode material layer and the auxiliary electrode with an etching solution in an area where the first opening is defined, etching the electrode material layer in an area where the second opening is defined, defining the undercut space on the auxiliary electrode, and forming the first electrode; and removing the patterned photoresist layer.

Optionally, in some embodiments of the present application, an activity of the first conductive layer is weaker than an activity of the second conductive layer, and an activity of the third conductive layer is weaker than the activity of the second conductive layer.

Optionally, in some embodiments of the present application, a thickness of the second conductive layer is greater than a thickness of the first conductive layer.

In the display panel and the manufacturing method thereof of the present application, a driving circuit layer is disposed on a substrate, wherein the driving circuit layer includes an auxiliary electrode, the auxiliary electrode includes a first conductive layer, a second conductive layer, and a third conductive layer that are stacked, the second conductive layer is disposed between the first conductive layer and the third conductive layer, the first conductive layer includes a protrusion portion protruding from the second conductive layer, and the third conductive layer includes an overhang portion protruding from the second conductive layer, wherein the overhang portion, a side surface of the second conductive layer, and the protrusion portion define an undercut space; a light-emitting layer is disconnected from the second electrode at the undercut space, and the second electrode extends into the undercut space and is connected to the protrusion portion.

That is, the present application adopts the auxiliary electrode as the undercut structure, so that the light-emitting layer and the second electrode are disconnected from each other at the undercut space of the auxiliary electrode, and the second electrode is connected to the auxiliary electrode, thereby achieving the effect of reducing voltage drop, and saving additional steps for forming an undercut structure.

BRIEF DESCRIPTION OF DRAWINGS

In order to more clearly illustrate the technical solutions of the embodiments of the present application, the drawings illustrating the embodiments will be briefly described below. Obviously, the drawings in the following description merely illustrate some embodiments of the present invention. Other drawings may also be obtained by those skilled in the art according to these figures without paying creative work.

FIG. 4 is a schematic flowchart of a method of manufacturing a display panel provided by an embodiment of the present application.

DETAILED DESCRIPTION OF PREFERRED EMBODIMENTS

Figure 1:
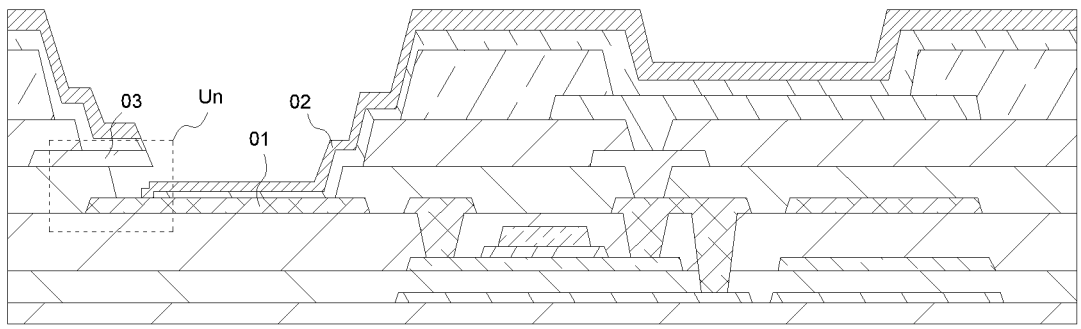
FIG. 1 is a schematic structural diagram of a display panel provided by the prior art.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application. In addition, it should be understood that the specific implementations described here are only used to illustrate and explain the application, and are not used to limit the application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

Embodiments of the present application provide a display panel and a manufacturing method thereof, which will be described in detail below. It should be noted that a description order of the following embodiments is not intended to limit a preferred order of the embodiments.

Figure 2:
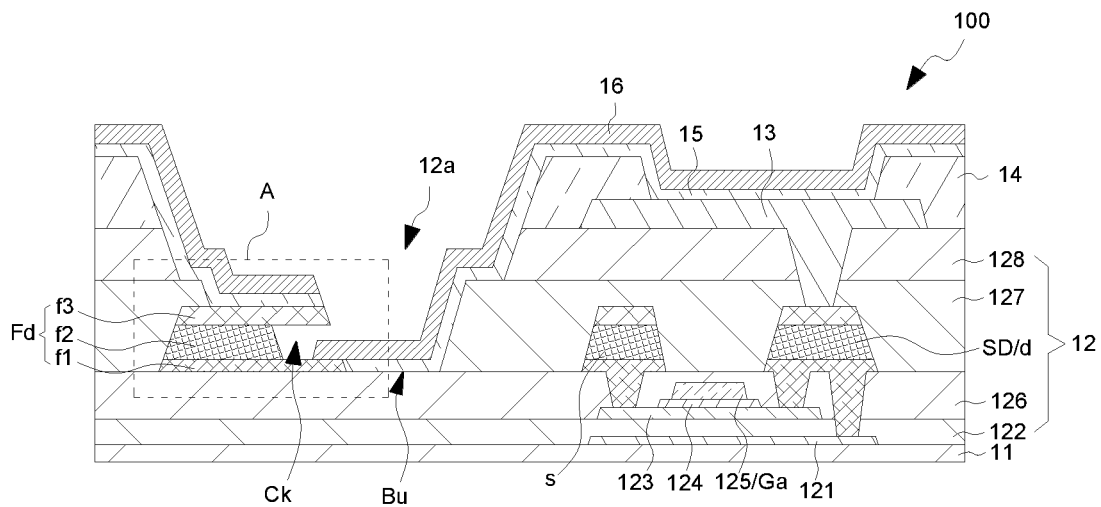
FIG. 2 is a schematic structural diagram of a display panel provided by an embodiment of the present application.
Figure 3:
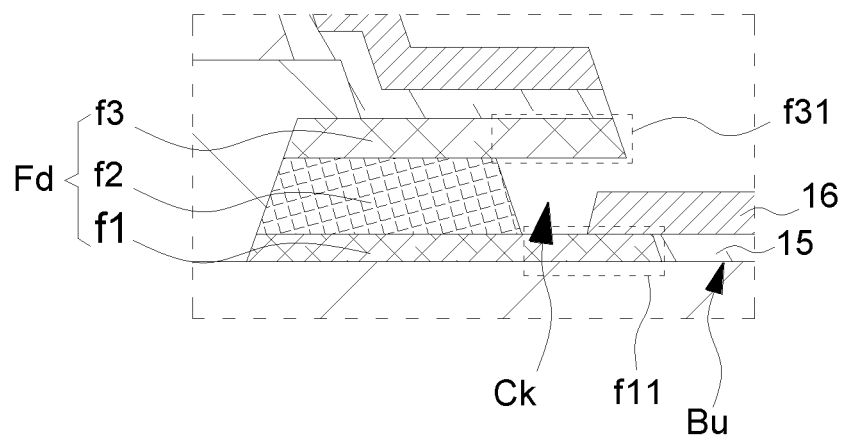
FIG. 3 is an enlarged view of part A in FIG. 1.

Referring to FIGS. 2 and 3, an embodiment of the present application provides a display panel 100, which includes a substrate 11, a driving circuit layer 12, a first electrode 13, a pixel definition layer 14, a light-emitting layer 15, and a second electrode 16.

The driving circuit layer 12 is disposed on the substrate 11. The driving circuit layer 12 includes an auxiliary electrode Fd, and the auxiliary electrode Fd includes a first conductive layer f1, a second conductive layer f2, and a third conductive layer f3 that are stacked. The second conductive layer f2 is disposed between the first conductive layer f1 and the third conductive layer f3. The first conductive layer f1 includes a protrusion portion f11 protruding from the second conductive layer f2. The third conductive layer f3 includes an overhang portion f31 protruding from the second conductive layer f2. The overhang portion f31, a side surface of the second conductive layer f2, and the protrusion portion f11 define an undercut space Ck.

The first electrode 13 is disposed on the driving circuit layer 12. The light-emitting layer 15 is disposed on the first electrode 13. The second electrode 16 is disposed on the light-emitting layer 15.

The light-emitting layer 15 is disconnected from the second electrode 16 at the undercut space Ck. The second electrode 16 extends into the undercut space Ck and is connected to the protrusion portion f31.

The present application adopts the auxiliary electrode Fd as the undercut structure, so that the light-emitting layer 15 and the second electrode 16 are disconnected at the undercut space Ck of the auxiliary electrode Fd. The second electrode 16 is connected to the first conductive layer f1 of the auxiliary electrode Fd to achieve an effect of reducing a voltage drop. The auxiliary electrode Fd is used as the undercut structure, which saves processes of additionally setting the undercut structure.

Optionally, the first conductive layer f1 is disposed between the second conductive layer f2 and the insulating layer to improve adhesion between the second conductive layer f2 and the insulating layer, to reduce a risk of separation of the auxiliary electrode Fd from the insulating layer.

Optionally, the third conductive layer f3 is disposed on the second conductive layer f2 to protect the second conductive layer f2 and reduce a risk of oxidation of the second conductive layer f2 in the subsequent thermal process.

Optionally, an activity of the first conductive layer f1 is weaker than an activity of the second conductive layer f2, and an activity of the third conductive layer f3 is weaker than the activity of the second conductive layer f2. Such an arrangement is convenient to ensure that the second conductive layer f2 has a stronger etching effect than the first conductive layer f1 and the third conductive layer f3 when the auxiliary electrode Fd is wet-etched, so as to form the undercut space Ck.

Optionally, an acid resistance of the second conductive layer f2 is weaker than an acid resistance of the first conductive layer f1 and an acid resistance of the third conductive layer f3.

Optionally, in this embodiment, materials of the first conductive layer f1 and the third conductive layer f3 are the same. The material of the first conductive layer f1 includes a metal alloy, and a material of the second conductive layer f2 is metal.

An activity of the metal alloy is weaker than an activity of the metal.

Optionally, in some embodiments, the materials of the first conductive layer f1 and the third conductive layer f3 may be the same or may be different.

In the present application, the materials of the first conductive layer f1 and the third conductive layer f3 may be conductive materials such as metal, metal alloy, or metal oxide. For example, each of the materials of the first conductive layer f1 and the third conductive layer f3 may be selected from one or any combination of molybdenum, titanium, nickel-molybdenum alloy, molybdenum-titanium alloy, and nickel-titanium alloy.

The material of the second conductive layer f2 can be a conductive material such as metal, metal alloy or metal oxide, for example, can be selected from one or any combination of copper, aluminum, silver, nickel, manganese, nickel-iron alloy, and indium tin oxide.

In some embodiments, each of the first conductive layer f1, the second conductive layer f2, and the third conductive layer f3 may also be a stacked structure.

Optionally, a thickness of the second conductive layer f2 is greater than a thickness of the first conductive layer f1. Such an arrangement reduces an impedance of the auxiliary electrode Fd and further reduces the current voltage drop.

Optionally, the driving circuit layer 12 includes a source-drain conductive layer SD disposed on the substrate 11. The auxiliary electrode Fd is formed on the source-drain conductive layer SD. The source-drain conductive layer SD also includes a source electrode s and a drain electrode d. The source-drain conductive layer SD is used to form the auxiliary electrode Fd, the source electrode s, and the drain electrode d at the same time, which can reduce the photomask process and improve the manufacturing efficiency.

Optionally, the source-drain conductive layer SD is formed of at least three conductive layers that are stacked. In this embodiment, since the auxiliary electrode Fd is formed on the source-drain conductive layer SD, a layered structure of the source-drain conductive layer SD is the same as a layered structure of the auxiliary electrode Fd, and materials of the same layer are also the same.

In some embodiments, the layered structures of the auxiliary electrode Fd and the source-drain conductive layer SD may also be different. For example, the source-drain conductive layer SD may have a single-layered structure, and the auxiliary electrode Fd may have a three-layered structure.

The embodiment of the present application is described by taking the driving circuit layer 12 including a top-gate thin film transistor as an example, but the present application is not limited thereto. For example, it may be a bottom-gate or double-gate thin film transistor. Since structures of bottom-gate and double-gate thin film transistors are the prior art, they will not be repeated herein for brevity.

Optionally, the driving circuit layer 12 is further provided with a connection hole 12a. The connection hole 12a exposes the auxiliary electrode Fd. A buffer space Bu is defined between the first conductive layer f1 and the connection hole 12a.

The buffer space Bu is arranged so that when the light-emitting layer 15 is formed by evaporation coating, the light-emitting layer 15 can be formed in the buffer space Bu as much as possible by adjusting the evaporation angle, and the risk of the light-emitting layer 15 entering the undercut space Ck is reduced. Therefore, the connection area between the second electrode 16 and the first conductive layer f1 is increased.

Specifically, the driving circuit layer 12 further includes a protective layer 127 and a planarization layer 128. The protective layer 127 is disposed on the source-drain conductive layer SD, and the planarization layer 28 is disposed on the protective layer 127. The connection hole 12a penetrates the planarization layer 128 and the protective layer 127.

Optionally, the protective layer 127 is connected to a side surface of the auxiliary electrode Fd. A part of the protective layer 127 extends to cover a part of the auxiliary electrode Fd.

Optionally, the driving circuit layer 12 further includes a light-shielding layer 121, a buffer layer 122, an active layer 123, a first insulating layer 124, a gate metal layer 125, and a second insulating layer 126.

The light-shielding layer 121 is disposed on the substrate 11. The buffer layer 122 is disposed on the light-shielding layer 121. The active layer 123 is disposed on the buffer layer 122 and overlaps the light-shielding layer 121. The first insulating layer 124 is disposed on the active layer 123. The gate metal layer 125 is disposed on the first insulating layer 124, and the gate metal layer 125 includes a gate electrode Ga. The second insulating layer 126 is disposed on the gate metal layer 125. The source-drain conductive layer SD is disposed on the second insulating layer 126.

Optionally, the substrate 11 may be a rigid substrate or a flexible substrate. The material of the substrate 11 includes glass, sapphire, silicon, silicon dioxide, polyethylene, polypropylene, polystyrene, polylactic acid, polyethylene dicarboxylate, polyethylene terephthalate, and polyethylene naphthalate. Ethylene glycol, polycarbonate, polyethersulfone, polyarylate-containing aromatic fluorotoluene, polycyclic olefin, polyimide, or polyurethane.

Optionally, the light-shielding layer 121 is made of a metal material, such as chromium, molybdenum, manganese, molybdenum, titanium, and the like.

Optionally, the material of the buffer layer 122 may include at least one of silicon nitride, silicon oxide, silicon oxynitride, or organic photoresist, but the present application is not particularly limited thereto.

Optionally, the material of the active layer 123 may include at least one of metal oxide semiconductor or polysilicon, but the present application is not particularly limited thereto.

Optionally, the material of the first insulating layer 124 may include at least one of silicon nitride, silicon oxide, aluminum oxide, silicon oxynitride, or organic photoresist, but the present application is not particularly limited thereto.

Optionally, the material of the gate metal layer 125 may include at least one of copper, aluminum, molybdenum copper alloy, molybdenum titanium/copper, molybdenum titanium/copper/molybdenum titanium, or molybdenum titanium/aluminum/molybdenum titanium, but the present application is not particularly limited thereto.

Optionally, the material of the second insulating layer 126 may include at least one of silicon nitride, silicon oxide, aluminum oxide, silicon oxynitride, or organic photoresist, but the present application is not particularly limited thereto.

Optionally, the material of the protective layer 127 may include at least one of silicon nitride, silicon oxide, silicon oxynitride, aluminum oxide, or magnesium oxide, but the present application is not particularly limited thereto.

Optionally, the material of the planarization layer 128 may include an organic transparent layer, such as transparent photoresist, epoxy resin, polyimide, polyvinyl alcohol, polymethylmethacrylate, polystyrene, etc., but the present application is not particularly limited thereto.

Optionally, one of the first electrode 13 and the second electrode 16 is an anode, and another of the first electrode 13 and the second electrode 16 is a cathode. This embodiment is described by taking the first electrode 13 as an anode and the second electrode 16 as a cathode as an example.

A material of the first electrode 13 may include at least one of indium tin oxide, silver, or indium zinc oxide, but the present application is not particularly limited thereto. The first electrode 13 may be a stacked structure of layers, or a single-layered structure, such as indium tin oxide/silver/indium tin oxide or indium tin oxide.

Optionally, the material of the pixel definition layer 14 may include an organic transparent layer, such as transparent photoresist, epoxy resin, polyimide, polyvinyl alcohol, polymethylmethacrylate, polyphenylene ethylene, and so on, but the present application is not particularly limited thereto.

Optionally, the material of the light-emitting layer 15 may be an organic material, for example, tris(8-hydroxyquinoline)aluminum(III) (Alq3), bis(2-methyl-8-hydroxyquinoline-N1,O8)-(1,1'-biphenyl-4-hydroxy)aluminum (BAlq), 4,4-bis(2,2-diphenylvinyl)-1,1-diphenyl (DPVBi), tris(4-methyl-8-quinolinolato)Al (III) (Almq3), 3-tert-butyl-9,10-bis(2-naphthalene)anthracene (TBADN).

Optionally, the material of the second electrode 16 may include at least one of indium tin oxide, silver, or indium zinc oxide, but the present application is not particularly limited thereto. The first electrode 13 may be a stacked structure of layers, or a single-layered structure, such as indium tin oxide/silver/indium tin oxide, indium tin oxide, or the like.

Please refer to FIG. 4. Correspondingly, the present application also relates to a method of manufacturing a display panel, which includes the following steps:

Step B1: forming a driving circuit layer on the substrate, wherein the driving circuit layer includes an auxiliary electrode, the auxiliary electrode includes a first conductive layer, a second conductive layer, and a third conductive layer that are stacked, and the second conductive layer is disposed between the first conductive layer and the third conductive layer.

Step B2: forming a first electrode on the driving circuit layer, and defining an undercut space on the auxiliary electrode, wherein the first conductive layer includes an overhang portion protruding from the second conductive layer, the third conductive layer includes a protrusion portion protruding from the second conductive layer, wherein the overhang portion, a side surface of the second conductive layer, and the protrusion portion define an undercut space.

Step B3: sequentially forming a pixel definition layer, a light-emitting layer, and a second electrode on the first electrode, wherein the light-emitting layer is disconnected from the second electrode at the undercut space, and the second electrode extends into the undercut space and is connected to the protrusion portion.

In the method of manufacturing the display panel of the present application, the auxiliary electrode is used as the undercut structure, so that the light-emitting layer and the second electrode are disconnected from each other at the undercut space of the auxiliary electrode, and the second electrode is connected to the auxiliary electrode, thereby achieving the effect of reducing voltage drop, and saving additional processes for forming an undercut structure.

The method of manufacturing the display panel of an embodiment of the present application will be described below.

Figure 5:
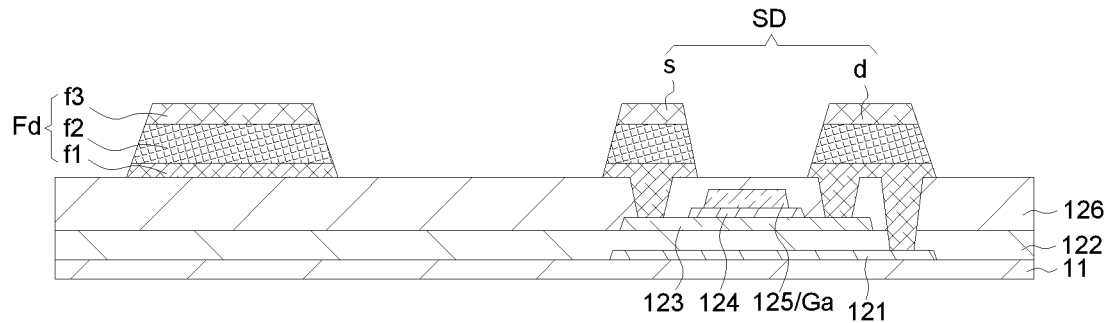
FIG. 5 is a schematic diagram of steps B11-B16 of the method of manufacturing the display panel provided by an embodiment of the present application.
Figure 6:
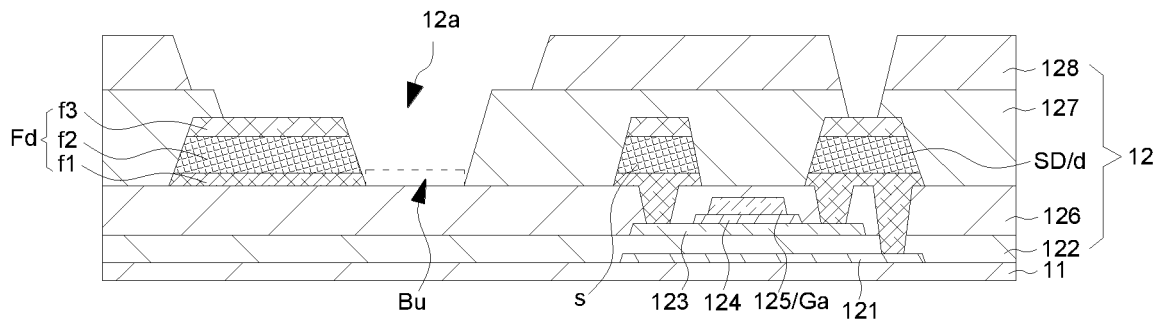
FIG. 6 is a schematic diagram of step B17 of the method of manufacturing the display panel provided by an embodiment of the present application.

Referring to FIG. 5 and FIG. 6, step B1, forming a driving circuit layer 12 on the substrate 11.

It should be noted that, the embodiment of the present application is described by taking the driving circuit layer 12 including a top-gate thin film transistor as an example, but the present application is not particularly limited thereto. For example, it may be a bottom-gate or double-gate thin film transistor. Since the structures of bottom-gate and double-gate thin film transistors are the prior art, they will not be repeated herein for brevity.

Optionally, step B1 includes the following steps:

Referring to FIG. 5, step B11: forming a buffer layer 122 on the substrate 11.

Optionally, the substrate 11 may be a rigid substrate or a flexible substrate. The material of the substrate 11 includes glass, sapphire, silicon, silicon dioxide, polyethylene, polypropylene, polystyrene, polylactic acid, polyethylene dicarboxylate, polyethylene terephthalate, and polyethylene naphthalate. Ethylene glycol, polycarbonate, polyethersulfone, polyarylate-containing aromatic fluorotoluene, polycyclic olefin, polyimide, or polyurethane.

A material of the buffer layer 122 may include at least one of silicon nitride, silicon oxide, silicon oxynitride, or organic photoresist, but the present application is not particularly limited thereto.

Step B1 may further include the step of forming a light-shielding layer 121 on the substrate 11. The light-shielding layer 121 is used to shield the active layer 123 in the subsequent process.

Optionally, the light-shielding layer 121 is made of a metal material, such as chromium, molybdenum, manganese, molybdenum, titanium, and the like.

Then, the method proceeds to step B12.

Referring to FIG. 5, step B12: forming an active layer 123 on the buffer layer 122.

Optionally, a material of the active layer 123 may include at least one of metal oxide semiconductor or polysilicon, but the present application is not particularly limited thereto.

Then, the method proceeds to step B13.

Referring to FIG. 5, step B13: forming a first insulating layer 124 on the buffer layer 122.

Optionally, the first insulating layer 124 is formed on the active layer 123. A material of the first insulating layer 124 may include at least one of silicon nitride, silicon oxide, aluminum oxide, silicon oxynitride, or organic photoresist, but the present application is not particularly limited thereto.

Then, the method proceeds to step B14.

Referring to FIG. 5, step B14: forming a gate metal layer 125 on the buffer layer 122, wherein the gate metal layer 125 includes a gate electrode Ga.

Optionally, the gate metal layer 125 is formed on the first insulating layer 124. A material of the gate metal layer 125 may include at least one of copper, aluminum, molybdenum titanium/copper, molybdenum copper alloy, molybdenum titanium/copper/molybdenum titanium, or molybdenum titanium/aluminum/molybdenum titanium, but the present application is not particularly limited thereto.

Then, the method proceeds to step B15.

Referring to FIG. 5, step B15: forming a second insulating layer 126 on the buffer layer 122.

Optionally, the second insulating layer 126 is formed on the gate metal layer 125. A material of the second insulating layer 126 may include at least one of silicon nitride, silicon oxide, aluminum oxide, silicon oxynitride, or organic photoresist, but the present application is not particularly limited thereto.

Then, the method proceeds to step B16.

Referring to FIG. 5, step B16: forming a source-drain conductive layer SD on the second insulating layer 126, wherein the source-drain conductive layer SD includes an auxiliary electrode Fd, a source electrode s, and a drain electrode d.

Optionally, the source-drain conductive layer SD is formed of at least three conductive layers that are stacked.

In this embodiment, since the auxiliary electrode Fd is formed on the source-drain conductive layer SD, a layered structure of the source-drain conductive layer SD is the same as a layered structure of the auxiliary electrode Fd, and materials of the same layer are also the same.

In some embodiments, the layered structures of the auxiliary electrode Fd and the source-drain conductive layer SD may also be different. For example, the source-drain conductive layer SD may have a single-layered structure, and the auxiliary electrode Fd may have a three-layered structure.

Optionally, in this embodiment, the auxiliary electrode Fd includes a first conductive layer f1, a second conductive layer f2, and a third conductive layer f3 that are stacked. The second conductive layer f2 is disposed between the first conductive layer f1 and the third conductive layer f3.

Optionally, the first conductive layer f1 is disposed between the second conductive layer f2 and the second insulating layer 126 to improve adhesion between the second conductive layer f2 and the second insulating layer 126, and reduce a risk of separation between the auxiliary electrode Fd and the second insulating layer 126.

Optionally, the third conductive layer f3 is disposed on the second conductive layer f2 to protect the second conductive layer f2 and reduce a risk of oxidation of the second conductive layer f2 in the subsequent thermal process.

Optionally, an activity of the first conductive layer f1 is weaker than an activity of the second conductive layer f2, and an activity of the third conductive layer f3 is weaker than the activity of the second conductive layer f2. Such an arrangement facilitates the subsequent process of wet etching the auxiliary electrode Fd to ensure that an etching effect of the second conductive layer f2 is stronger than etching effects of the first conductive layer f1 and the third conductive layer f3, so as to form a subsequent undercut space Ck.

Optionally, an acid resistance of the second conductive layer f2 is weaker than an acid resistance of the first conductive layer f1 and the third conductive layer f3.

Optionally, materials of the first conductive layer f1 and the third conductive layer f3 may be the same or different, which may be conductive materials such as metal, metal alloy, or metal oxide. For example, each of the materials of the first conductive layer f1 and the third conductive layer f3 may be selected from one or any combination of molybdenum, titanium, nickel-molybdenum alloy, molybdenum-titanium alloy, and nickel-titanium alloy.

The material of the second conductive layer f2 can be a conductive material such as metal, metal alloy or metal oxide, for example, can be selected from one or any combination of copper, aluminum, silver, nickel, manganese, nickel-iron alloy, and indium tin oxide.

In some embodiments, each of the first conductive layer f1, the second conductive layer f2, and the third conductive layer f3 may also be a stacked structure.

Optionally, a thickness of the second conductive layer f2 is greater than a thickness of the first conductive layer f1. Such an arrangement reduces an impedance of the auxiliary electrode Fd and further reduces the current voltage drop.

Then, the method proceeds to step B17.

Referring to FIG. 6, step B17: sequentially forming a protective layer 127, a planarization layer 128, and a connection hole 12a on the source-drain conductive layer SD. The connection hole 12a exposes at least one side surface of the auxiliary electrode Fd.

Optionally, the protective layer 127 covers a part of the auxiliary electrode Fd.

Optionally, the material of the protective layer 127 may include at least one of silicon nitride, silicon oxide, silicon oxynitride, aluminum oxide, or magnesium oxide, but the present application is not particularly limited thereto.

Optionally, the material of the planarization layer 128 may include an organic transparent layer, such as transparent photoresist, epoxy resin, polyimide, polyvinyl alcohol, polymethylmethacrylate, polystyrene etc., but the present application is not particularly limited thereto.

Then, the method proceeds to step B2.

Referring to FIGS. 7-11, step B2: forming a first electrode 13 on the driving circuit layer 12, and defining an undercut space Ck on the auxiliary electrode Fd.

Figure 7:
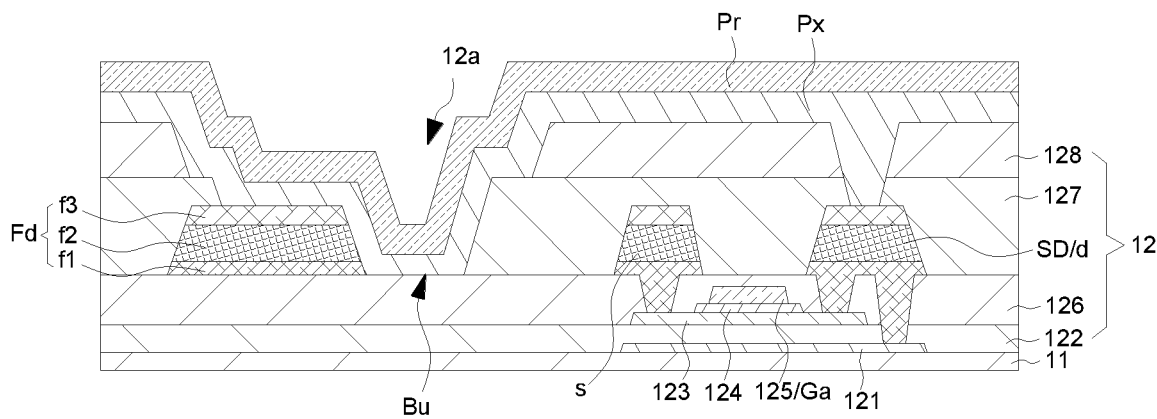
FIG. 7 is a schematic diagram of steps B21-B22 of the method of manufacturing the display panel provided by an embodiment of the present application.

Optionally, step B2 includes the following steps:

Referring to FIG. 7, step B21: forming an electrode material layer Px on the planarization layer 128. A part of the electrode material layer Px covers the auxiliary electrode Fd.

Optionally, a material of the electrode material layer Px may include at least one of indium tin oxide, silver, or indium zinc oxide, but the present application is not particularly limited thereto. The first electrode 13 may be a stacked structure of layers or a single-layered structure, such as indium tin oxide/silver/indium tin oxide or indium tin oxide.

Then, the method proceeds to step B22.

Referring to FIG. 7, step B22: forming a photoresist layer Pr on the electrode material layer Px.

Then, the method proceeds to step B23.

Figure 8:
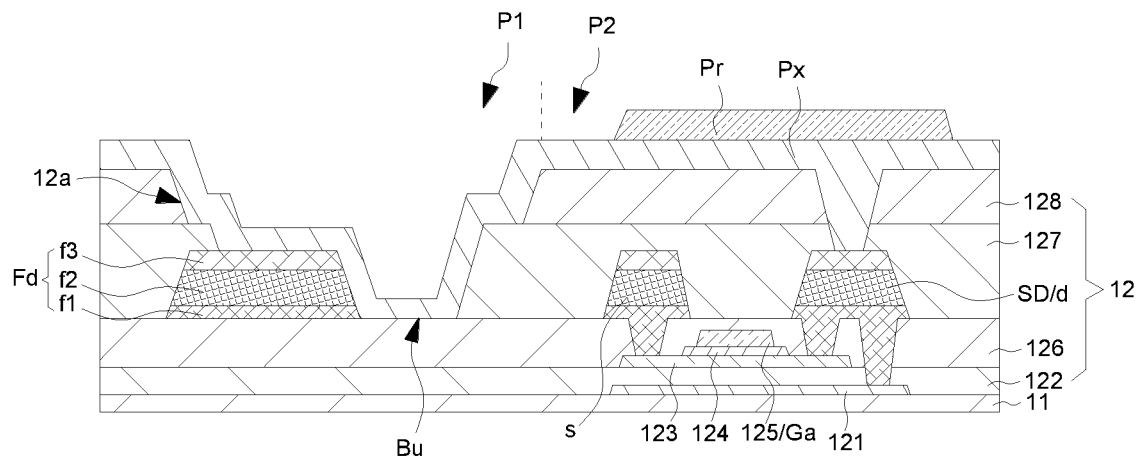
FIG. 8 is a schematic diagram of step B23 of the method of manufacturing the display panel provided by an embodiment of the present application.

Referring to FIG. 8, step B23: patterning the photoresist layer Pr to form a first opening P1 and a second opening P2. The first opening P1 corresponds to the connection hole 12a, and the second opening P2 corresponds to a non-pixel area.

Then, the method proceeds to step B24.

Figure 9:
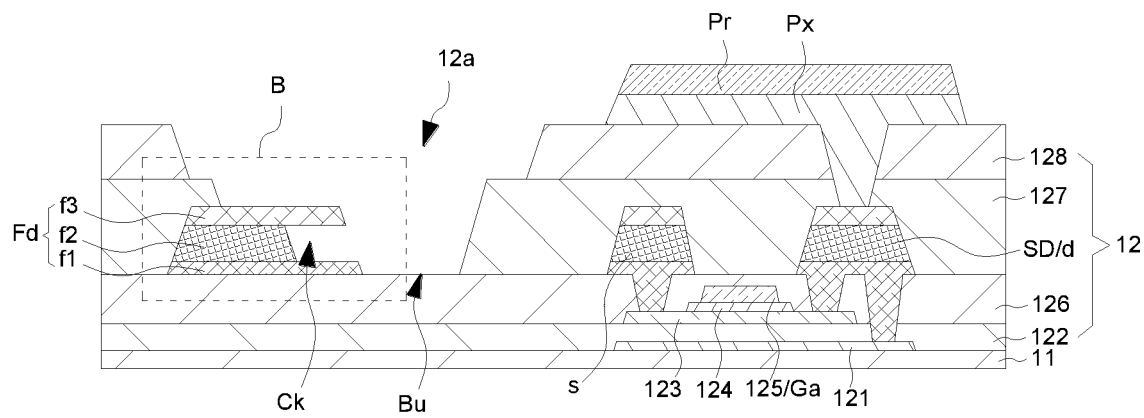
FIG. 9 is a schematic diagram of step B24 of the method of manufacturing the display panel provided by an embodiment of the present application.
Figure 10:
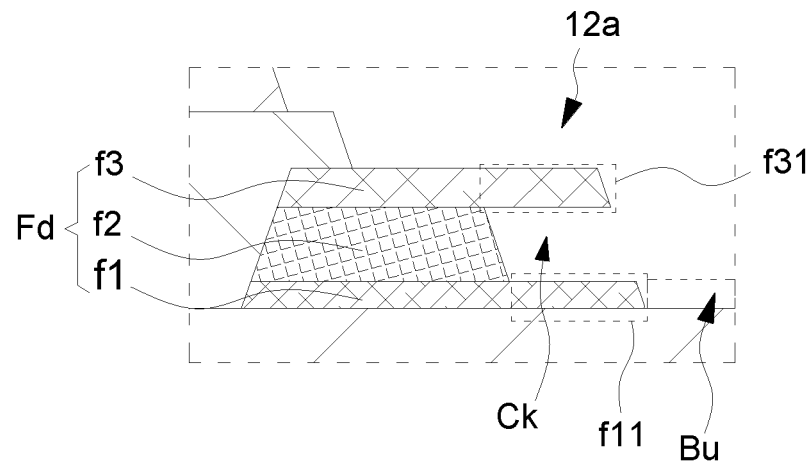
FIG. 10 is an enlarged view of part B in FIG. 9.

Referring to FIG. 9 and FIG. 10, step B24: etching the electrode material layer Px and the auxiliary electrode Fd with an etching solution in an area where the first opening P1 is defined, etching the electrode material layer Px in an area where the second opening P2 is defined, defining the undercut space Ck on the auxiliary electrode Fd, and forming the first electrode 13.

Optionally, the etching solution may include phosphoric acid, nitric acid, and acetic acid.

Under an action of the etching solution, the electrode material layer Px in the areas where the first opening P1 and the second opening P2 are located is etched away, then the auxiliary electrode Fd is exposed by the first opening P1, and the etching solution continues to etch an exposed portion of the auxiliary electrode Fd. Because the first conductive layer f1 and the third conductive layer f3 have stronger acid resistance than the second conductive layer f2, or the metal activity of the first conductive layer f1 and the metal activity of the third conductive layer f3 are both weaker than the metal activity of the second conductive layer f2, the second conductive layer f2 can be quickly etched, and the first conductive layer f1 and the third conductive layer f3 are etched slowly or hardly, thereby defining the undercut space Ck.

That is, the first conductive layer f1 includes a protrusion portion f11 protruding from the second conductive layer f2. The third conductive layer f3 includes an overhang portion f31 protruding from the second conductive layer f2. The overhang portion f31, a side surface of the second conductive layer f2, and the protrusion portion f11 define an undercut space Ck.

Optionally, a buffer space Bu is arranged so that when the light-emitting layer 15 is formed by evaporation coating, the light-emitting layer 15 can be formed in the buffer space Bu as much as possible by adjusting the evaporation angle, and the risk of the light-emitting layer 15 entering the undercut space Ck is reduced. Therefore, the connection area between the second electrode 16 and the first conductive layer f1 is increased.

Then, the method proceeds to step B25.

Figure 11:
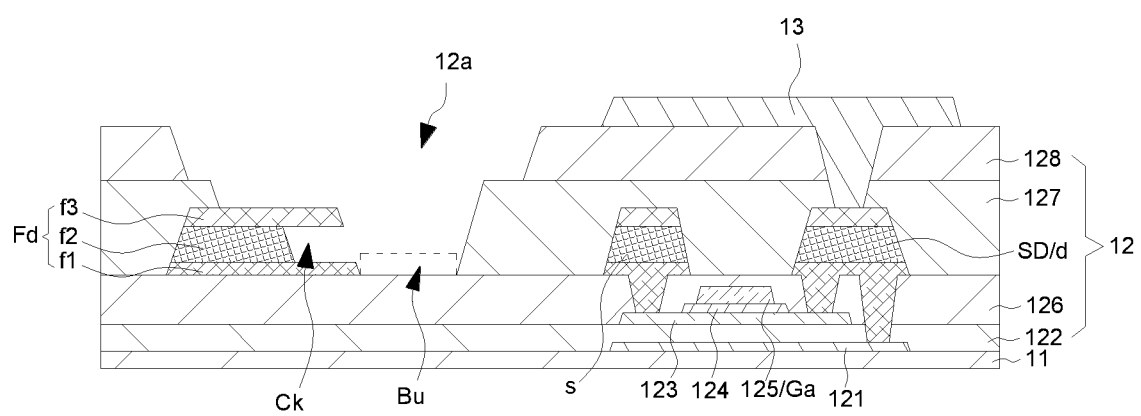
FIG. 11 is a schematic diagram of step B25 of the method of manufacturing the display panel provided by an embodiment of the present application.

Referring to FIG. 11, step B25: removing the patterned photoresist layer Pr.

Then, the method proceeds to step B3.

Figure 12:
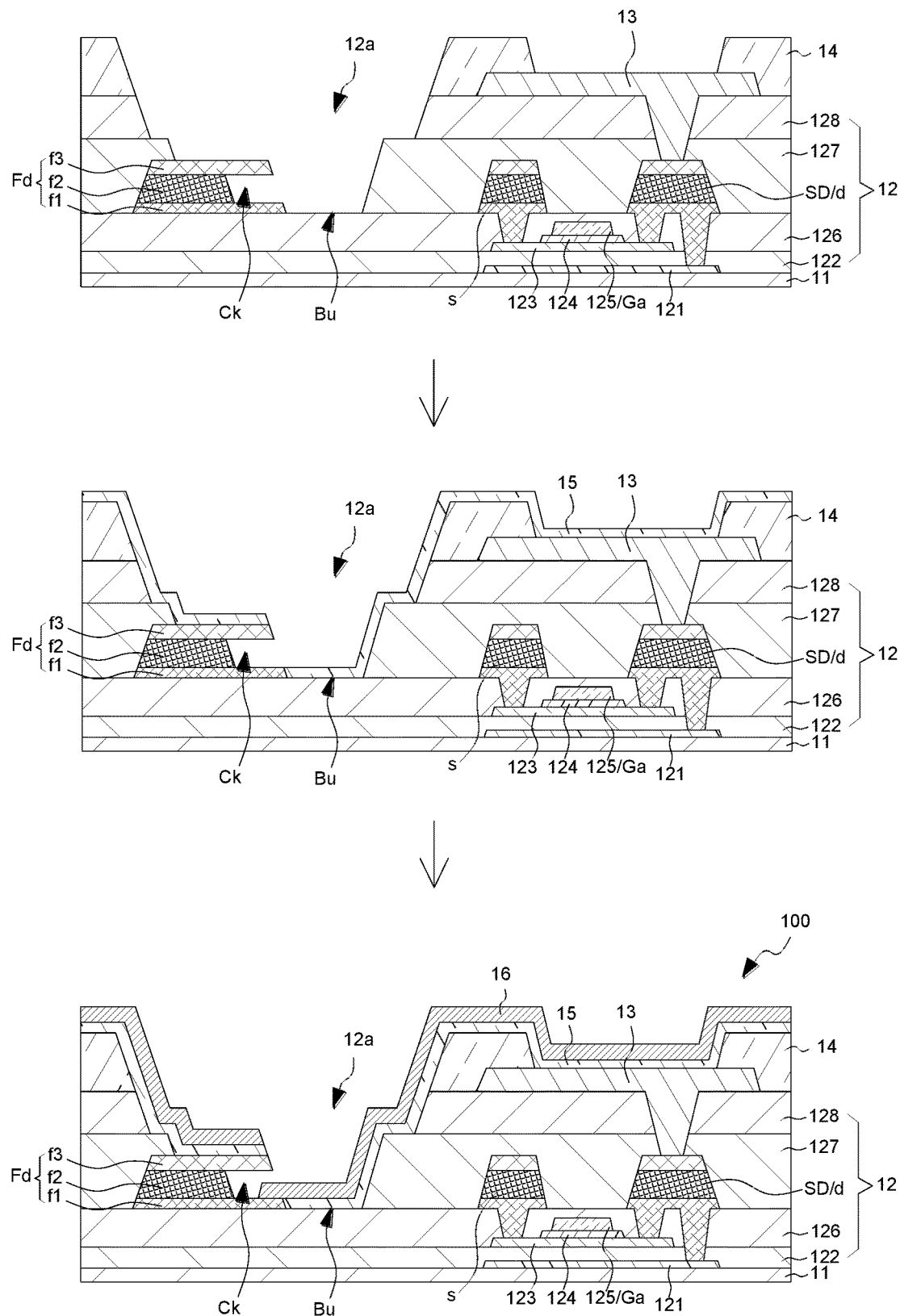
FIG. 12 is a schematic diagram of step B3 of the method of manufacturing the display panel provided by an embodiment of the present application.

Referring to FIG. 12, step B3: sequentially forming a pixel defining layer 14, a light-emitting layer 15, and a second electrode 16 on the first electrode 13.

The light-emitting layer 15 is disconnected from the second electrode 16 at the undercut space Ck. The second electrode 16 extends into the undercut space Ck and is connected to the protrusion portion f31.

Optionally, the material of the pixel definition layer 14 may include an organic transparent layer, such as transparent photoresist, epoxy resin, polyimide, polyvinyl alcohol, polymethylmethacrylate, polyphenylene ethylene, and so on, but the present application is not particularly limited thereto.

Optionally, the material of the light-emitting layer 15 may be an organic material, for example, tris(8-hydroxyquinoline)aluminum(III) (Alq3), bis(2-methyl-8-hydroxyquinoline-N1,O8)-(1,1'-biphenyl-4-hydroxy)aluminum (BAlq), 4,4-bis(2,2-diphenylvinyl)-1,1-diphenyl (DPVBi), tris(4-methyl-8-quinolinolato)Al (III) (Almq3), 3-tert-butyl-9,10-bis(2-naphthalene) anthracene (TBADN).

Optionally, the material of the second electrode 16 may include at least one of indium tin oxide, silver, or indium zinc oxide, but the present application is not particularly limited thereto. The first electrode 13 may be a stacked structure of layers, or a single-layered structure, such as indium tin oxide/silver/indium tin oxide, indium tin oxide, or the like.

As such, the method of manufacturing the display panel of an embodiment of the present application is completed. It should be noted that this manufacturing method can be used to manufacture the display panel 100 of each of the above-mentioned embodiments.

In the display panel and the manufacturing method thereof of the present application, a driving circuit layer is disposed on a substrate, wherein the driving circuit layer includes an auxiliary electrode, the auxiliary electrode includes a first conductive layer, a second conductive layer, and a third conductive layer that are stacked, the second conductive layer is disposed between the first conductive layer and the third conductive layer, the first conductive layer includes an overhang portion protruding from the second conductive layer, the third conductive layer includes a protrusion portion protruding from the second conductive layer, wherein the overhang portion, a side surface of the second conductive layer, and the protrusion portion define an undercut space; a light-emitting layer is disconnected from the second electrode at the undercut space, and the second electrode extends into the undercut space and is connected to the protrusion portion.

That is, the present application adopts the auxiliary electrode as the undercut structure, so that the light-emitting layer and the second electrode are disconnected from each other at the undercut space of the auxiliary electrode, and the second electrode is connected to the auxiliary electrode, thereby achieving the effect of reducing voltage drop, and saving additional processes for forming an undercut structure.

The display panel and the manufacturing method thereof provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising:
    a substrate;
    a driving circuit layer disposed on the substrate, wherein the driving circuit layer comprises an auxiliary electrode, the auxiliary electrode comprises a first conductive layer, a second conductive layer, and a third conductive layer that are stacked, the second conductive layer is disposed between the first conductive layer and the third conductive layer, the first conductive layer comprises a protrusion portion protruding from the second conductive layer, and the third conductive layer comprises an overhang portion protruding from the second conductive layer, wherein the overhang portion, a side surface of the second conductive layer, and the protrusion portion define an undercut space;
    a first electrode disposed on the driving circuit layer;
    a pixel definition layer disposed on the first electrode, and
    a light-emitting layer and a second electrode, wherein the light-emitting layer is disposed on the first electrode, the second electrode is disposed on the light-emitting layer, the light-emitting layer is disconnected from the second electrode at the undercut space, and the second electrode extends into the undercut space and is connected to the protrusion portion;
    wherein the driving circuit layer further comprises a protective layer and a planarization layer, the protective layer is disposed on the auxiliary electrode, and the planarization layer is disposed on the protective layer;
    the driving circuit layer is provided with a connection via hole, and the connection via hole penetrates the planarization layer and the protective layer; and
    the connection via hole exposes the auxiliary electrode, and a buffer space is defined between the first conductive layer and the connection via hole.

2. The display panel according to claim 1, wherein the driving circuit layer comprises a source-drain conductive layer disposed on the substrate, the auxiliary electrode is formed in the source-drain conductive layer, and the source-drain conductive layer also comprises source and drain electrodes.

3. The display panel according to claim 1, wherein an activity of the first conductive layer is weaker than an activity of the second conductive layer, and an activity of the third conductive layer is weaker than the activity of the second conductive layer.

4. The display panel according to claim 3, wherein a thickness of the second conductive layer is greater than a thickness of the first conductive layer.

5. The display panel according to claim 3, wherein materials of the first conductive layer and the third conductive layer are the same, and the material of the first conductive layer comprises a metal alloy, and material of the second conductive layer is metal; and
an activity of the metal alloy is weaker than an activity of the metal.

6. The display panel according to claim 1, wherein the protective layer is connected to a side surface of the auxiliary electrode, and a part of the protective layer extends to cover a part of the auxiliary electrode.

7. A display panel, comprising:
a substrate;
a driving circuit layer disposed on the substrate, wherein the driving circuit layer comprises an auxiliary electrode, the auxiliary electrode comprises a first conductive layer, a second conductive layer, and a third conductive layer that are stacked, the second conductive layer is disposed between the first conductive layer and the third conductive layer, the first conductive layer comprises a protrusion portion protruding from the second conductive layer, and the third conductive layer comprises an overhang portion protruding from the second conductive layer, wherein the overhang portion, a side surface of the second conductive layer, and the protrusion portion define an undercut space;
a first electrode disposed on the driving circuit layer; and
a light-emitting layer and a second electrode, wherein the light-emitting layer is disposed on the first electrode, the second electrode is disposed on the light-emitting layer; the light-emitting layer is disconnected from the second electrode at the undercut space; and the second electrode extends into the undercut space and is connected to the protrusion portion;
wherein the driving circuit layer further comprises a protective layer and a planarization layer, the protective layer is disposed on the auxiliary electrode, and the planarization layer is disposed on the protective layer;
the driving circuit layer is provided with a connection via hole, and the connection via hole penetrates the planarization layer and the protective layer; and
the connection via hole exposes the auxiliary electrode, and a buffer space is defined between the first conductive layer and the connection via hole.

8. The display panel according to claim 7, wherein the driving circuit layer comprises a source-drain conductive layer disposed on the substrate, the auxiliary electrode is formed in the source-drain conductive layer, and the source-drain conductive layer also comprises source and drain electrodes.

9. The display panel according to claim 7, wherein an activity of the first conductive layer is weaker than an activity of the second conductive layer, and an activity of the third conductive layer is weaker than the activity of the second conductive layer.

10. The display panel according to claim 9, wherein a thickness of the second conductive layer is greater than a thickness of the first conductive layer.

11. The display panel according to claim 9, wherein materials of the first conductive layer and the third conductive layer are the same, and the material of the first conductive layer comprises a metal alloy, and a material of the second conductive layer is metal; and
an activity of the metal alloy is weaker than an activity of the metal.

12. The display panel according to claim 7, wherein the protective layer is connected to a side surface of the auxiliary electrode, and a part of the protective layer extends to cover a part of the auxiliary electrode.

13. A method of manufacturing a display panel, comprising the following steps:
forming a driving circuit layer on the substrate, wherein the driving circuit layer comprises an auxiliary electrode, the auxiliary electrode comprises a first conductive layer, a second conductive layer, and a third conductive layer that are stacked, and the second conductive layer is disposed between the first conductive layer and the third conductive layer;
forming a first electrode on the driving circuit layer, and defining an undercut space on the auxiliary electrode, wherein the first conductive layer comprises an overhang portion protruding from the second conductive layer, the third conductive layer comprises a protrusion portion protruding from the second conductive layer, wherein the overhang portion, a side surface of the second conductive layer, and the protrusion portion define the undercut space; and
sequentially forming a pixel definition layer, a light-emitting layer, and a second electrode on the first electrode, wherein the light-emitting layer is disconnected from the second electrode at the undercut space, and the second electrode extends into the undercut space and is connected to the protrusion portion;
wherein the step of forming the driving circuit layer on the substrate comprises the following steps:
forming a buffer layer on the substrate;
forming an active layer on the buffer layer;
forming a first insulating layer on the buffer layer;
forming a gate metal layer on the buffer layer, wherein the gate metal layer comprises a gate electrode;
forming a second insulating layer on the buffer layer;
forming a source-drain conductive layer on the second insulating layer, wherein the source-drain conductive layer comprises an auxiliary electrode, a source electrode, and a drain electrode; and
sequentially forming a protective layer, a planarization layer, and a connection via hole on the source-drain conductive layer, wherein the connection via hole exposes at least one side surface of the auxiliary electrode.

14. The manufacturing method of the display panel according to claim 13, wherein a buffer space is defined between the first conductive layer and a wall of the connection via hole.

15. The method of manufacturing the display panel according to claim 13, wherein the step of forming the first electrode on the driving circuit layer, and defining the undercut space on the auxiliary electrode comprises the following steps:
forming an electrode material layer on the planarization layer, wherein a part of the electrode material layer covers the auxiliary electrode;
forming a photoresist layer on the electrode material layer;
patterning the photoresist layer to form a first opening and a second opening, wherein the first opening corresponds to the connection via hole, and the second opening corresponds to a non-pixel area;
etching the electrode material layer and the auxiliary electrode with an etching solution in an area where the first opening is defined, etching the electrode material layer in an area where the second opening is defined, defining the undercut space on the auxiliary electrode, and forming the first electrode; and
removing the patterned photoresist layer.

16. The method of manufacturing the display panel according to claim 15, wherein an activity of the first conductive layer is weaker than an activity of the second conductive layer, and an activity of the third conductive layer is weaker than the activity of the second conductive layer.

17. The manufacturing method of the display panel according to claim 13, wherein a thickness of the second conductive layer is greater than a thickness of the first conductive layer.

18. The display panel according to claim 7, wherein the protective layer is connected to a side surface of the auxiliary electrode, and a part of the protective layer extends to cover a part of the auxiliary electrode.

19. The display panel according to claim 7, wherein a part of the light-emitting layer is located in the buffer space.

20. The display panel according to claim 7, wherein each of the first conductive layer, the second conductive layer, and the third conductive layer is a stacked structure.

\* \* \* \* \*